(12) United States Patent
Hattori

(10) Patent No.: US 10,224,927 B2
(45) Date of Patent: Mar. 5, 2019

(54) INPUT DEVICE, TERMINAL DEVICE, AND COMPUTER-READABLE RECORDING MEDIUM

(71) Applicant: FUJITSU LIMITED, Kawasaki-shi, Kanagawa (JP)

(72) Inventor: Masashi Hattori, Kawasaki (JP)

(73) Assignee: Fujitsu Limited, Kawasaki-shi, Kanagawa (JP)

( * ) Notice: Subject to any disclaimer, the term of this patent is extended or adjusted under 35 U.S.C. 154(b) by 0 days.

(21) Appl. No.: 15/644,359

(22) Filed: Jul. 7, 2017

(65) Prior Publication Data

US 2018/0062650 A1 Mar. 1, 2018

(30) Foreign Application Priority Data

Aug. 31, 2016 (JP) ................................. 2016-170112

(51) Int. Cl.
*H03K 17/96* (2006.01)

(52) U.S. Cl.
CPC .................... *H03K 17/9622* (2013.01); *H03K 2217/94026* (2013.01)

(58) Field of Classification Search
CPC .................................................. H03K 17/9622
USPC ........................................................... 341/33
See application file for complete search history.

(56) References Cited

U.S. PATENT DOCUMENTS

| 9,176,600 | B2* | 11/2015 | O'Keeffe | G06F 3/033 |
|---|---|---|---|---|
| 2002/0021280 | A1 | 2/2002 | Kato et al. | |
| 2009/0073128 | A1* | 3/2009 | Marsden | G06F 3/023 345/168 |
| 2011/0018695 | A1* | 1/2011 | Bells | G06F 3/016 340/407.2 |
| 2012/0026110 | A1* | 2/2012 | Yamano | G06F 3/0418 345/173 |
| 2012/0056848 | A1* | 3/2012 | Yamano | G06F 3/0236 345/174 |
| 2016/0334912 | A1* | 11/2016 | Protasio Ribeiro | G06F 3/0414 |
| 2016/0357296 | A1* | 12/2016 | Picciotto | G06F 3/016 |
| 2016/0357297 | A1* | 12/2016 | Picciotto | G06F 3/0488 |
| 2017/0170670 | A1* | 6/2017 | Shimura | H02J 7/0021 |
| 2017/0199571 | A1* | 7/2017 | Ciesla | G06F 3/016 |

FOREIGN PATENT DOCUMENTS

| JP | 2007-141269 | 6/2007 |
|---|---|---|
| JP | 2010-539624 | 12/2010 |
| JP | 2012-027875 | 2/2012 |
| JP | 2013-037497 | 2/2013 |

* cited by examiner

*Primary Examiner* — Santiago Garcia
(74) *Attorney, Agent, or Firm* — Osha Liang LLP

(57) ABSTRACT

An input device, includes: a sensor that outputs an output value dependent on a pressing force; a determination unit that determines that a contacted place is pressed, based on the output value output from the sensor, in a case where a first output value is detected and subsequently a third output value that is less than the first output value and greater than a second output value that is less than the first output value is detected through the second output value; and an output unit that outputs a result determined by the determination unit.

8 Claims, 12 Drawing Sheets

FIG.8

| | PARAMETER | VALUE |
|---|---|---|
| THRESHOLD OF OUTPUT VALUE | A | 18 h (4.5 V) |
| | B | 0C h (2.3 V) |
| | C | 10 h (3.0 V) |
| | D | 06 h (1.2 V) |
| THRESHOLD OF NUMBER OF TIMES PROVIDED BY COUNTER | n | 25 |
| | m | 10 |
| | p | 75 |

INPUT DEVICE, TERMINAL DEVICE, AND COMPUTER-READABLE RECORDING MEDIUM

CROSS-REFERENCE TO RELATED APPLICATION

This application is based upon and claims the benefit of priority of the prior Japanese Patent Application No. 2016-170112, filed on Aug. 31, 2016, the entire contents of which are incorporated herein by reference.

FIELD

The embodiments discussed herein are related to an input device, a terminal device, and a computer-readable recording medium.

BACKGROUND

In recent years, as a tablet terminal is used on a desk, it may be impossible to use a thin keyboard that is connected to the tablet terminal. A thin key board is provided with no keystroke because of being a thin type and detects an input through a key by using an electrostatic capacitance sensor or a pressure sensor for the key. Such a key detects an input based on whether or not an output value from an electrostatic capacitance sensor or a pressure sensor is greater than a preset threshold. It is proposed that an input determination threshold is changed depending on detected acceleration on a terminal with a touch panel.

Japanese Patent Application Publication No. 2012-027875

However, as an input is detected based on whether or not it is greater than a threshold, for example, an operation for putting a hand on a home position for a keyboard may cause an erroneous input. For example, as it is intended that an input is executed by means of touch typing similarly to a keyboard with a keystroke, an unintended input is executed so that it is more difficult to use than the keyboard with a keystroke.

SUMMARY

According to an aspect of an embodiment, an input device, includes: a sensor that outputs an output value dependent on a pressing force; a determination unit that determines that a contacted place is pressed, based on the output value output from the sensor, in a case where a first output value is detected and subsequently a third output value that is less than the first output value and greater than a second output value that is less than the first output value is detected through the second output value; and an output unit that outputs a result determined by the determination unit.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 8 is a diagram illustrating an example of a threshold of an output value and a threshold of the number of times provided by a counter;

DESCRIPTION OF EMBODIMENTS

Preferred embodiments of the present invention will be explained with reference to accompanying drawings. The disclosed technique is not limited by the present embodiments. The following embodiments may appropriately be combined without inconsistency.

[a] First Embodiment

Figure 1:
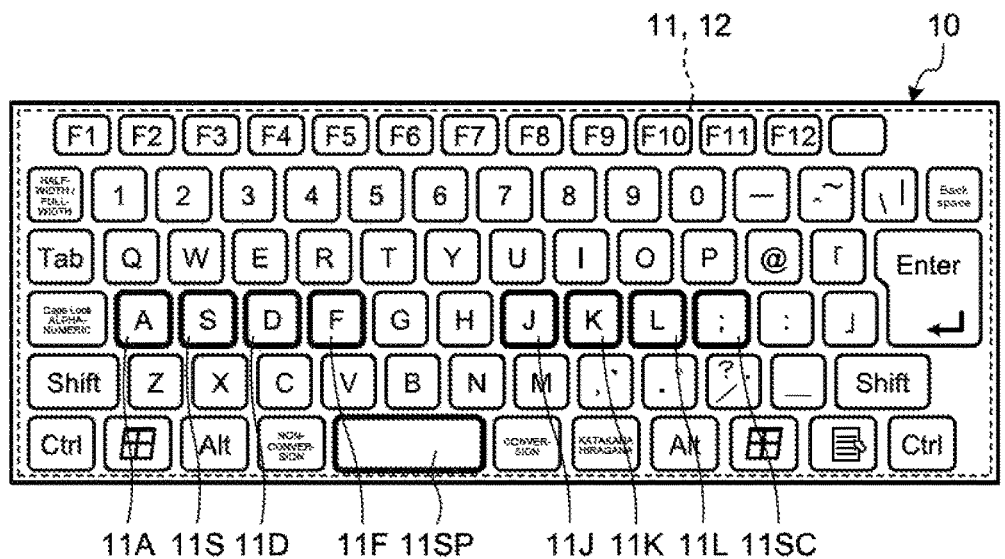
FIG. 1 is a diagram illustrating an example of an input device according to a first embodiment.

FIG. 1 is a diagram illustrating an example of an input device according to a first embodiment. An input device 10 as illustrated in FIG. 1 is an example of a thin keyboard with no key stroke and has a plurality of keys 11. Each of the plurality of keys 11 has a sensor 12 that outputs an output value dependent on a level of contact. For example, an electrostatic capacitance sensor or a pressure sensor can be used for the sensor 12.

A key 11 that corresponds to a home position is a key 11A that indicates an "A" key, a key 11S that indicates an "S" key, a key 11D that indicates a "D" key, a key 11F that indicates an "F" kay, or a key 11SP that indicates a "space" key. The key 11 that corresponds to a home position is a key 11J that indicates a "J" key, a key 11K that indicates a "K" key, a key 11L that indicates an "L" key, or a key 11SC that indicates a "; (semicolon)" key. As an input is executed by using the input device 10, a user puts his or her fingers on the key 11A, the key 11S, the key 11D, the key 11F, the key 11SP, the key 11J, the key 11K, the key 11L, and the key 11SC that are provided at home positions to execute such an input.

Figure 2:
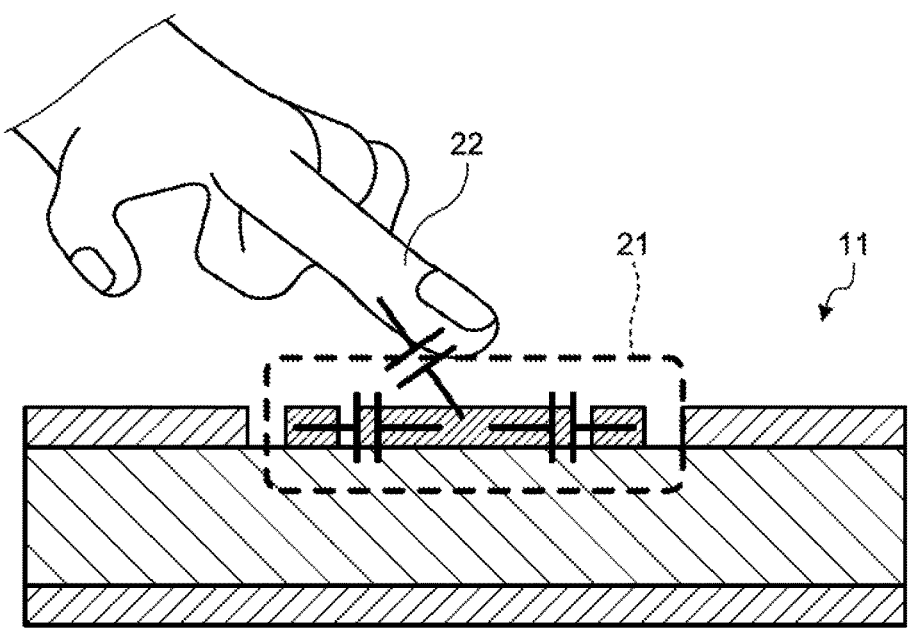
FIG. 2 is a diagram illustrating an example of an electrostatic capacitance sensor.

Herein, detection of a press that is executed by a conventional electrostatic capacitance sensor and a pressure sensor will be described by using FIG. 2 to FIG. 4. FIG. 2 is a diagram illustrating an example of an electrostatic capacitance sensor. As illustrated in FIG. 2, the key 11 has an electrostatic capacitance sensor 21 that is an example of the sensor 12. The electrostatic capacitance sensor 21 detects, for example, a capacitance detection pattern that is a change in electrostatic capacitance in a case where a finger 22 approaches or contacts.

Figure 3:
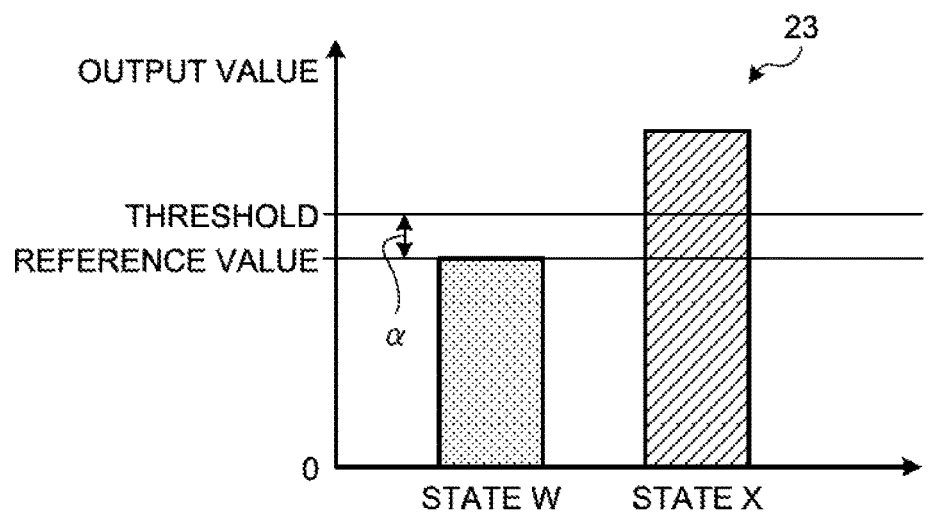
FIG. 3 is a diagram illustrating an example of a relationship between electrostatic capacitance and a threshold.

FIG. 3 is a diagram illustrating an example of a relationship between electrostatic capacitance and a threshold. FIG. 3 is an example of conventional detection of an input on the electrostatic capacitance sensor 21. As illustrated in a graph 23 of FIG. 3, a state W is a case where the finger 22 is not put closer to the electrostatic capacitance sensor 21 and an output value from the electrostatic capacitance sensor 21 is, for example, near a reference value based on an average for a predetermined period of time. A state X is a case where the finger 22 is put closer to the electrostatic capacitance sensor 21 and an output value from the electrostatic capacitance sensor 21 is a value greater than a threshold. Herein, determination of an input on a corresponding key 11 is provided in a case where an input that is greater than a simply set threshold is provided or a case where an input that is greater than a threshold is provided while the threshold is a value of a reference value +α. That is, an input is conventionally detected based on whether or not an output value from the electrostatic capacitance sensor 21 is greater than a preset threshold. Accordingly, an input is executed by merely putting a hand on a keyboard.

Figure 4:
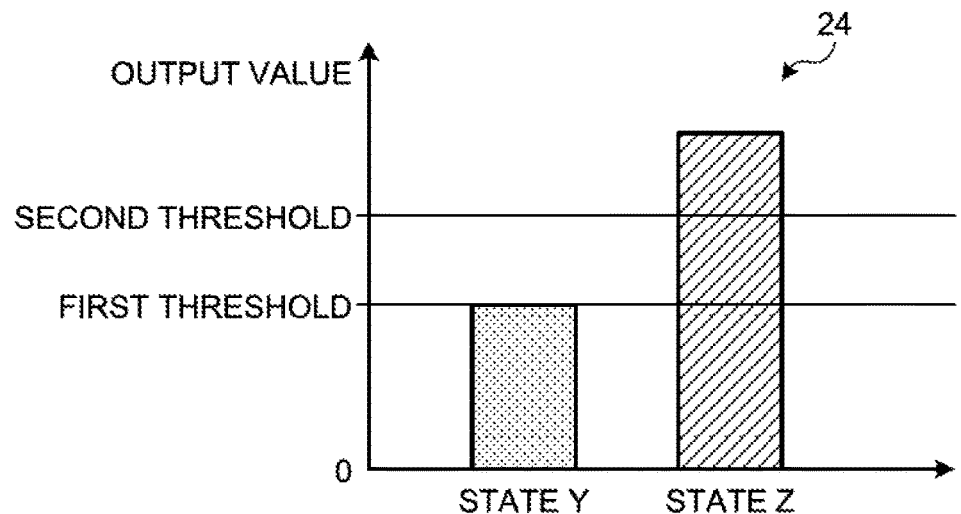
FIG. 4 is a diagram illustrating an example of a relationship between a pressure and a threshold.

FIG. 4 is a diagram illustrating an example of a relationship between a pressure and a threshold. FIG. 4 is an example of conventional detection of an input on a pressure sensor. As illustrated in a graph 24 of FIG. 4, a state Y is a case where the finger 22 is put on the key 11 and an output value from a pressure sensor reaches a first threshold for detecting that the finger 22 is put thereon. A state Z is a case where an operation for pressing the key 11 is executed and an output value from a pressure sensor is greater than a second threshold for detecting an input. That is, the state Y indicates detection of a state where a hand is put on a home position and the state Z indicates detection of an input provided by pressing the key 11. Accordingly, a pressure sensor can detect what strength the key 11 is pressed with, but an input is executed by merely putting a hand on a keyboard in a case where a threshold is low. In a case where a high threshold is provided in a pressure sensor, a strong press is needed for an input so that a hand gets tired by touch typing or an input of a long sentence. That is, a conventional thin keyboard merely uses a threshold for the electrostatic capacitance sensor 21 or the pressure sensor to determine a press of the key 11, and hence, it is difficult to provide usability identical to that of a keyboard with a keystroke.

In the present embodiment, an output value from the sensor 12 is analyzed on a time axis and whether or not an input is provided is determined by a pattern of the output value. That is, the sensor 12 of the input device 10 outputs an output value dependent on a pressing force. The input device 10 determines that a contacted place is pressed in a case where a first output value is detected based on an output value output from the sensor 12, and subsequently, a third output value that is less than the first output value and greater than a second output value that is less than the first output value is detected through the second output value. The input device 10 outputs a determined result. Thereby, the input device 10 can reduce erroneously detecting an operation for putting the finger 22 on the key 11 as a press.

Figure 5:
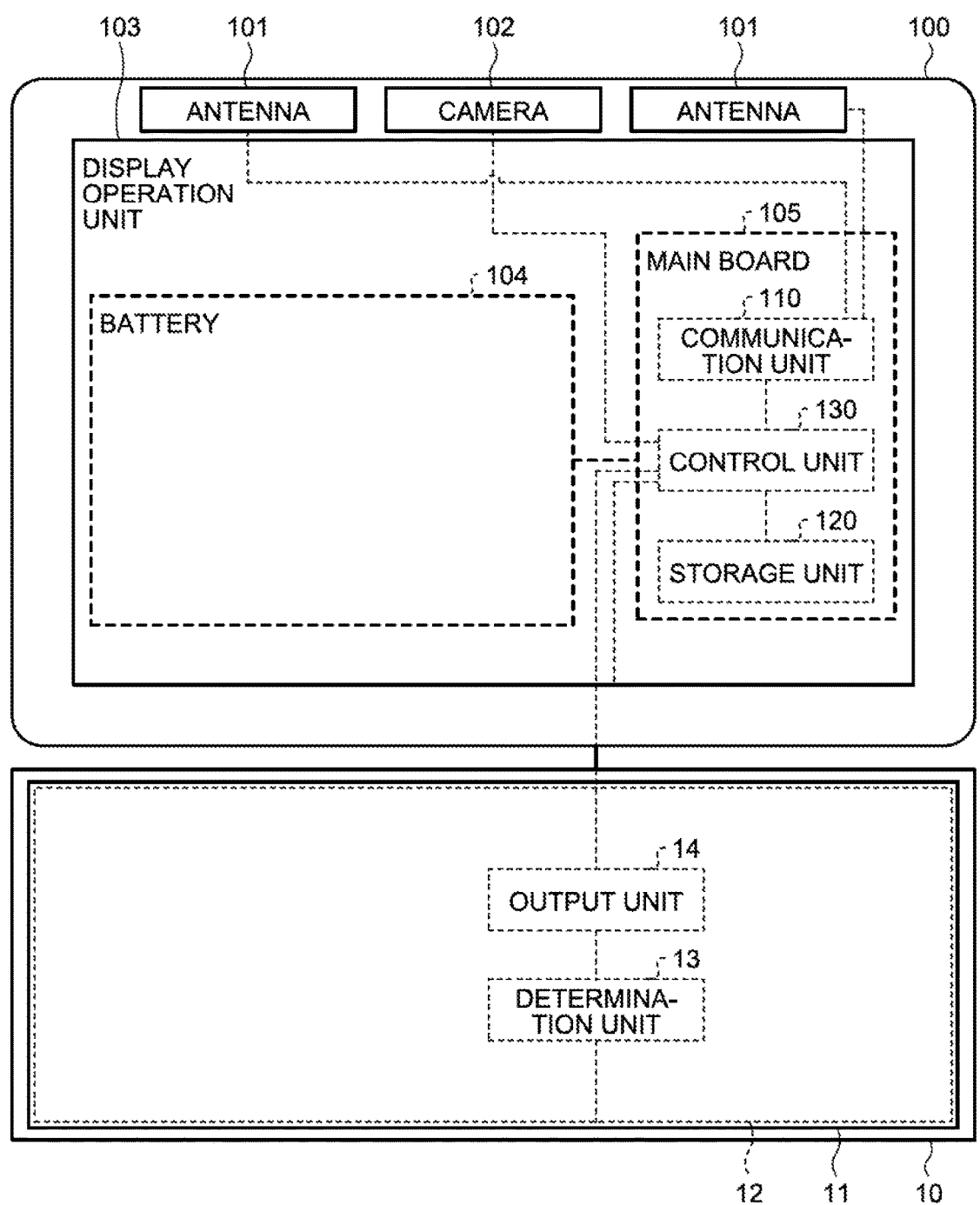
FIG. 5 is a diagram illustrating an example of a hardware configuration of a terminal device according to a first embodiment.
Figure 6:
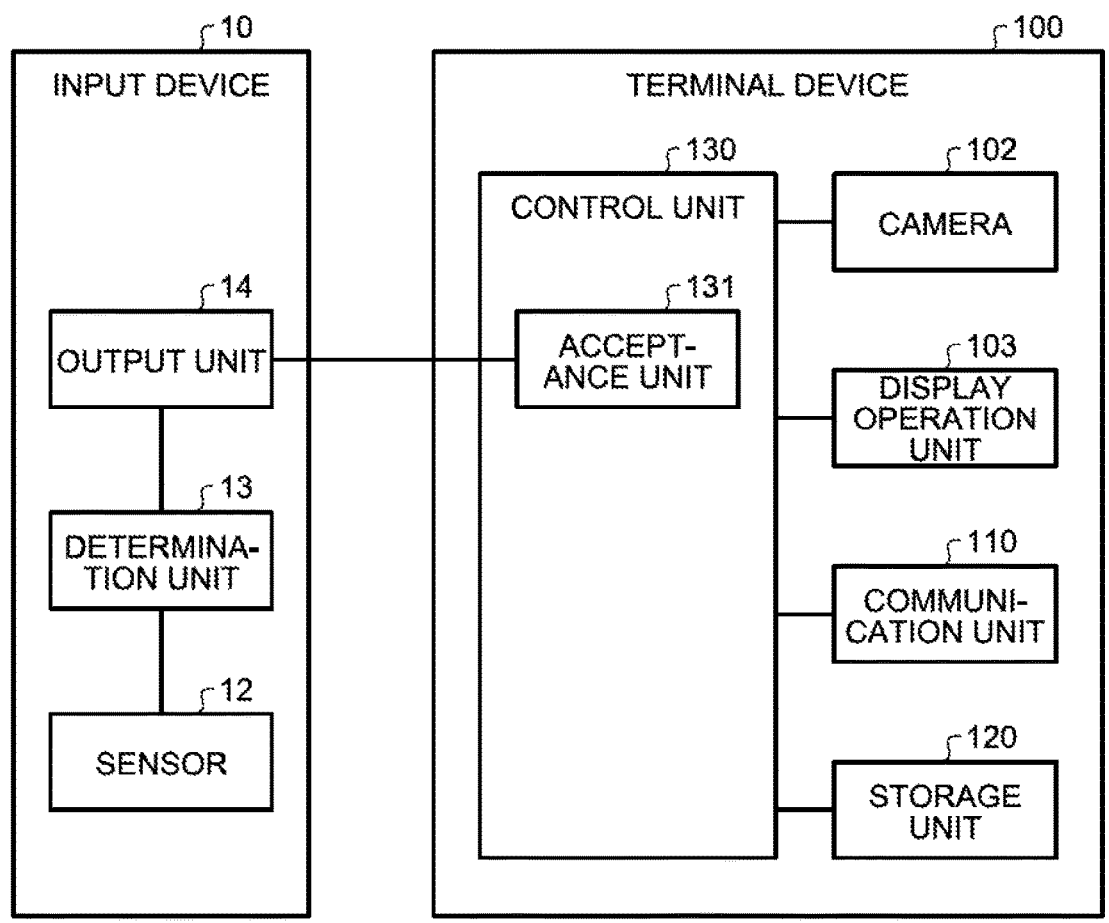
FIG. 6 is a block diagram illustrating an example of a functional configuration of a terminal device according to a first embodiment.

Next, a hardware configuration and a functional configuration of the input device 10 and a terminal device 100 that is connected to the input device 10 will be described by using FIG. 5 and FIG. 6. FIG. 5 is a diagram illustrating an example of a hardware configuration of a terminal device according to the first embodiment. FIG. 6 is a block diagram illustrating an example of a functional configuration of a terminal device according to the first embodiment.

The input device 10 and the terminal device 100 are connected in a wired manner by using, for example, a Universal Serial Bus (USB). The input device 10 and the terminal device 100 may be connected in a wireless manner by using, for example, Bluetooth (registered trademark).

As illustrated in FIG. 5 and FIG. 6, the input device 10 includes a plurality of keys 11, a plurality of sensors 12, a determination unit 13, and an output unit 14. FIG. 5 omits illustration of each key 11 and each sensor 12 and collectively illustrates a key 11 and a sensor 12.

As illustrated in FIG. 1, the key 11 is each key of a thin keyboard with no key stroke. Each of the plurality of keys 11 has the sensor 12 that outputs an output value dependent on a level of contact, that is, a pressing force. For example, an electrostatic capacitance sensor or a pressure sensor can be used for the sensor 12. Although a case where an electrostatic capacitance sensor is used for the sensor 12 is provided as an example in the following description, a pressure sensor may be used.

The determination unit 13 is realized by, for example, an integrated circuit such as an Application Specific Integrated Circuit (ASIC) or a Field Programmable Gate Array (FPGA). The determination unit 13 may be realized by, for example, a Micro Processing Unit (MPU) or the like that executes a program stored in an internal storage device while a Random Access Memory (RAM) is a working area thereof. For example, a Central Processing Unit (CPU), instead of the MPU, may be used for the determination unit 13.

The determination unit 13 determines a press of the key 11 based on an output value output from the plurality of sensors 12 that correspond to the plurality of keys 11, respectively. An output value output from each sensor 12 is input to the determination unit 13. The determination unit 13 detects a first output value based on an input output value of each sensor 12 and subsequently determines whether or not a third output value that is less than the first output value and higher than a second output value that is less than the first output value is detected through the second output value. That is, the determination unit 13 determines that the key 11 that corresponds to a contacted sensor 12 is pressed, in a case where the first output value is detected and subsequently the third output value is detected through the second output value.

The determination unit 13 detects a first output value by using a first threshold, a second output value by using a second threshold, and a third output value by using the first threshold and the third threshold. The determination unit 13 may detect a third output value in a case where a time when an output value from the sensor 12 is greater than or equal to the third threshold among thresholds for detecting the third output value continues for a predetermined period of time. The determination unit 13 outputs a key code of the key 11 determined to be pressed, to the output unit 14. The output unit 14 will be described after descriptions for FIG. 7 through FIG. 12.

Figure 7:
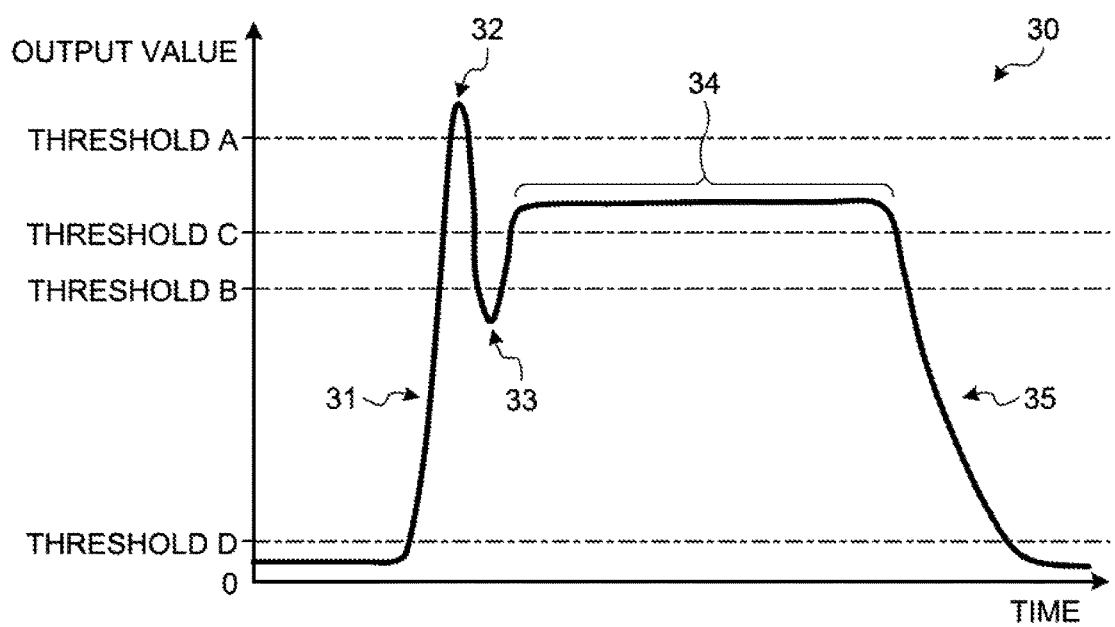
FIG. 7 is a diagram illustrating an example of an output value in a case where a key with a finger not being put thereon is pressed.

Next, determination of an output value from the sensor 12 in the determination unit 13 will be described by using FIG. 7 to FIG. 12. FIG. 7 is a diagram illustrating an example of an output value in a case where a key with a finger not being put thereon is pressed. As illustrated in FIG. 7, a graph 30 is a graph that illustrates a time course of an output value in a case where the key 11 with a finger not being put thereon is pressed. Herein, it is considered that an input is executed by not pushing but hitting the key 11 of a keyboard that is the input device 10. First, as a user puts his or her finger closer to the key 11 for a key input, an output value from the sensor 12 rises as indicated by an output value 31. As the key 11 is hit, an output value from the sensor 12 temporarily becomes a large value that is a greater than or equal to a threshold A, as indicated by an output value 32. Subsequently, an output value from the sensor 12 reactively passes through an output value 33 that is less than or equal to a threshold B and keep an output value 34 that is greater than or equal to a threshold C that is less than the threshold A and greater than the threshold B. The output value 34 is detected as a third output value as a time when it is greater than or equal to the threshold C continues for a predetermined period of time. A predetermined period of time can be determined based on a sampling rate of the sensor 12, and can be, for example, 75 ms. Herein, the key 11 is provided in a state where it has been pressed. Subsequently, as a finger leaves the key 11, an output value from the sensor 12 falls as indicated by an output value 35 and becomes a threshold D or less. As an output value that indicates such a pattern is input from the sensor 12, the determination unit 13 determines that the key 11 is pressed.

That is, the determination unit 13 determines a set of a "portion with a large value for a short period of time (output value 32)"+a "portion with a reactively falling value for a short period of time (output value 33)"+a "portion with a comparatively large value for a long period of time (output value 34)"+a "portion with a decreasing value (output value 35)". That is, the determination unit 13 determines a key input on the key 11 in a case where such a set of input patterns is detected. The determination unit 13 determines a key input on the key 11 in a case of continuous input as long as a portion that corresponds to the output value 34 continues for a predetermined period of time or longer, even if a portion that corresponds to the output value 35 is absent.

Herein, a threshold will be described that corresponds to an output value from the sensor 12. The threshold A is a threshold for detecting a first output value, for example, the output value 32. The threshold B is a threshold for detecting a second output value, for example, the output value 33. The threshold C is a threshold for detecting a third output value, for example, the output value 34. The threshold D is a threshold for detecting that a finger leaves the key 11. A first output value, a second output value, and a third output value correspond to pressures for pressing the sensor 12.

The determination unit 13 includes a counter CA that corresponds to the threshold A, a counter CB that corresponds to the threshold B, and a counter CC that corresponds to the threshold CC, as not being illustrated, in order to detect each output value by using such thresholds. The determination unit 13 includes a threshold n that corresponds to the counter CA, a threshold m that corresponds to the counter CB, and a threshold p that corresponds to the counter CC. The determination unit 13 includes a flag FA that indicates that a first output value is detected in a case where a value of the counter CA is greater than or equal to the threshold n. The determination unit 13 includes a flag FB that indicates that a second output value is detected in a case where a value of the counter CB is greater than or equal to the threshold m. The determination unit 13 includes a flag FC that indicates that a third output value is detected in a case where a value of the counter CC is greater than or equal to the threshold p.

FIG. 8 is a diagram illustrating an example of a threshold of an output value and a threshold of the number of times provided by a counter. As illustrated in FIG. 8, the thresholds A to D are parameters of a threshold of an output value. Values that correspond to the thresholds A to D are, for example, values in a case where a voltage at an input side is 186 mV and that at an output side is a hexadecimal number of "1", that is, a digital value, based on a specification of an A/D converter. An inside of parentheses indicates a voltage of an A/D converter at an input side thereof. In an example of FIG. 8, the threshold A=18 h (4.5 V), the threshold B=0 C h (2.3 V), the threshold C=10 h (3.0V), and the threshold D=06 h (1.2 V).

The thresholds n to p are parameters of a threshold of the number of times that counting is executed in the counters CA to CC. Values that correspond to the thresholds n to p are values that indicate the number of times that counting is executed in the counters CA to CC. In an example of FIG. 8, the threshold n=25 times, the threshold m=10 times, and the threshold p=75 times. The threshold n corresponds to a period of time for the output value 32 that is greater than or equal to the threshold A in the graph 30 of FIG. 7. The threshold m corresponds to a period of time for the output value 33 that is less than or equal to the threshold B in the graph 30. The threshold p corresponds to a period of time for the output value 34 that is greater than or equal to the threshold C and less than or equal to the threshold A in the graph 30. That is, the threshold p is also a value that determines a predetermined period of time for detecting a third output value.

The determination unit 13 determines an output value from the sensor 12, for example, in accordance with a sampling rate of the sensor 12. For example, as the input device 10 is powered on, the determination unit 13 repeats determination of an output value from the sensor 12 until it is powered off. In a case where a sampling rate of the sensor 12 is, for example, 1 kHz, the determination unit 13 scans, that is, determines an output value from the sensor 12, 1000 times a second. A rate of a key input is 5 to 6 times a second even for a speedy person, and hence, as sampling is executed at 1 kHz, a hit is scanned 200 times. Division into approximately 200 parts is executed in an example of the graph 30 of FIG. 7. That is, the determination unit 13 repeatedly executes determination of an output value from the sensor 20 approximately 200 times in order to detect a pattern of the graph 30 of FIG. 7.

Figure 9:
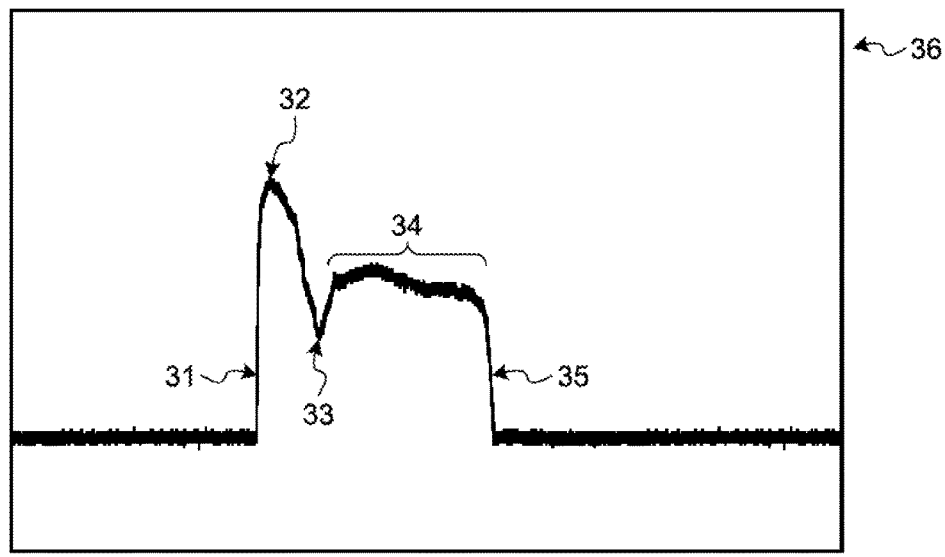
FIG. 9 is a diagram illustrating an example of a real waveform of an output value in a case where a key with a finger not being put thereon is pressed.

FIG. 9 is a diagram illustrating an example of a real waveform of an output value in a case where a key with where a finger is not put thereon is pressed. A graph 36 of FIG. 9 is an example of a real waveform of the graph 30 as illustrated in FIG. 7. In the graph 36, it can be found that a waveform is changed in order of the output value 31, the output value 32, the output value 33, the output value 34, and the output value 35, similarly to the graph 30.

Figure 10:
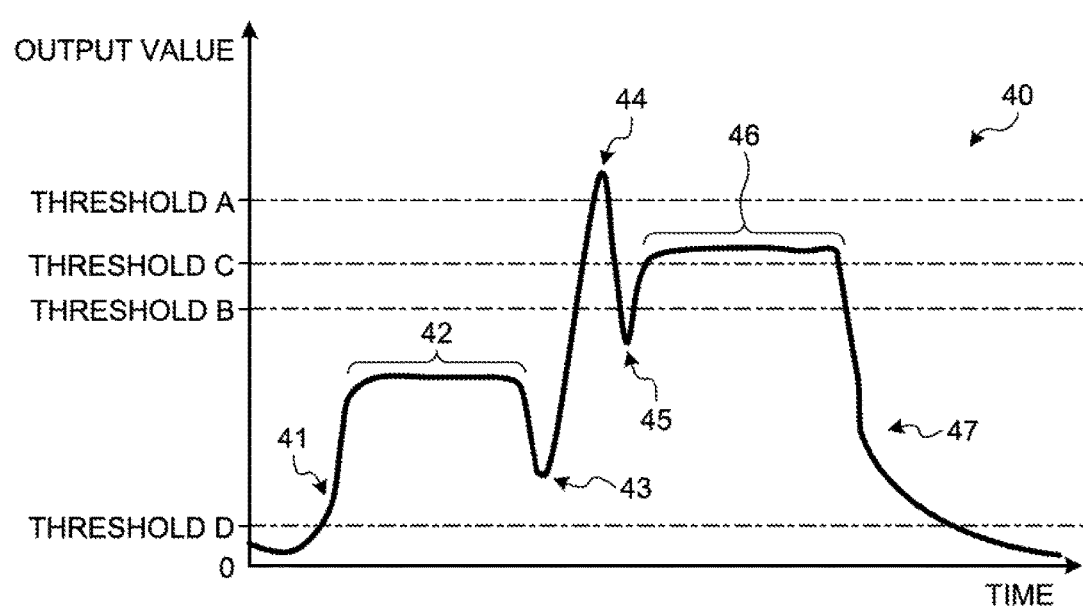
FIG. 10 is a diagram illustrating an example of an output value in a case where a key with a finger being put thereon is pressed.

FIG. 10 is a diagram illustrating an example of an output value in a case where a key with a finger being put thereon is pressed. As illustrated in FIG. 10, a graph 40 is a graph that indicates a time course of an output value in a case where a key 11 with a finger being put thereon is pressed.

First, as a user puts his or her finger closer to the key 11 for a key input, an output value from the sensor 12 rises as indicated by an output value 41. As a finger is put on the key 11, an output value from the sensor 12 continues as an output value 42 that is greater than or equal to a threshold D and less than or equal to a threshold B. That is, the output value 42 is an initial value of an output value of the key 11 with a finger being put thereon, in a case where a hand is put on a home position.

Then, as a user once causes his or her finger to leave the key 11 in order to execute a key input, an output value from the sensor 12 once decreases as indicated by an output value 43. As the key 11 is hit, an output value from the sensor 12 is temporarily a large value that is greater than or equal to a threshold A as indicated by an output value 44. Subsequently, an output value from the sensor 12 reactively passes through an output value 45 that is less than or equal to the threshold B and continues as an output value 46 that is greater than or equal to a threshold C that is less than the threshold A and greater than the threshold B. Herein, the key 11 is provided in a state where it is pressed. Subsequently, as a finger leaves the key 11, an output value from the sensor 12 falls to the threshold D or less as indicated by an output value 47. Thus, for the key 11 with a finger being put thereon, the determination unit 13 does not determine that the key 11 is pressed, in a state where the finger is put thereon, but determines that the key 11 is pressed, when a user hits the key 11, that is, in a case where an operation for executing a key input is executed consciously.

Figure 11:
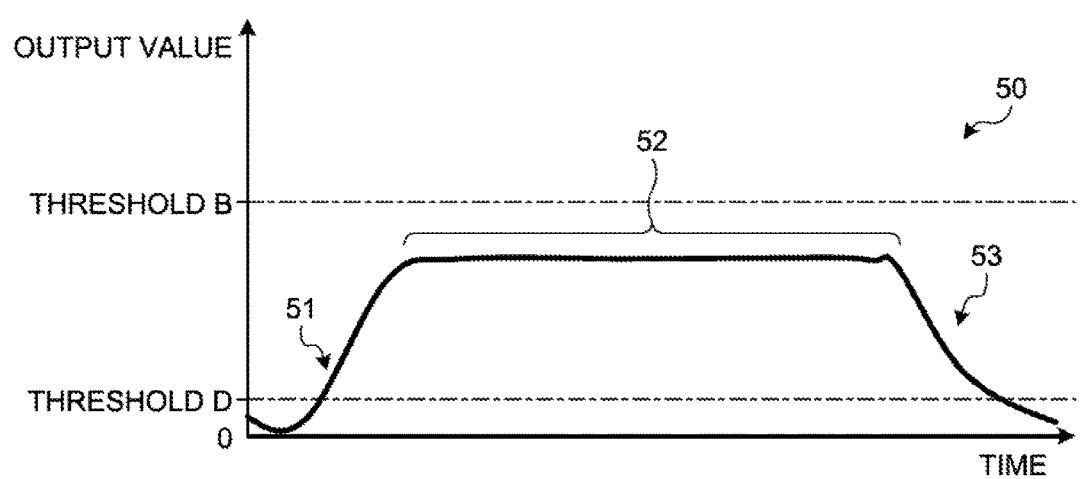
FIG. 11 is a diagram illustrating an example of an output value in a case where a key with a finger being put thereon is not pressed.

FIG. 11 is a diagram illustrating an example of an output value in a case where a key with a finger being put thereon is not pressed. As illustrated in FIG. 11, a graph 50 is a graph that indicates a time course of an output value in a case where the key 11 with a finger being put thereon is not pressed but leaves therefrom. First, as a user puts his or her finger closer to the key 11 for a key input, an output value from the sensor 12 rises as indicated by an output value 51. As a finger is put on the key 11, an output value from the sensor 12 continues as an output value 52 that is greater than or equal to a threshold D and less than or equal to a threshold B. Subsequently, as a finger leaves the key 11, an output value from the sensor 12 falls to the threshold D or less as indicated by an output value 53. Thus, a certain level of an output value from the sensor 12 is input to the determination unit 13 in a state where a hand is put on a home position, that is, a state where a finger is put on the key 11. However, an output value from the sensor 12 does not has a change with time, like a time of a key input, that is, an output value pattern as illustrated in FIG. 7, and hence, the determination unit 13 does not determine that the key 11 is pressed. That is, there is a difference in application of a force between a press intended to press and a press in a case where a finger is put at a home position or the like.

Figure 12:
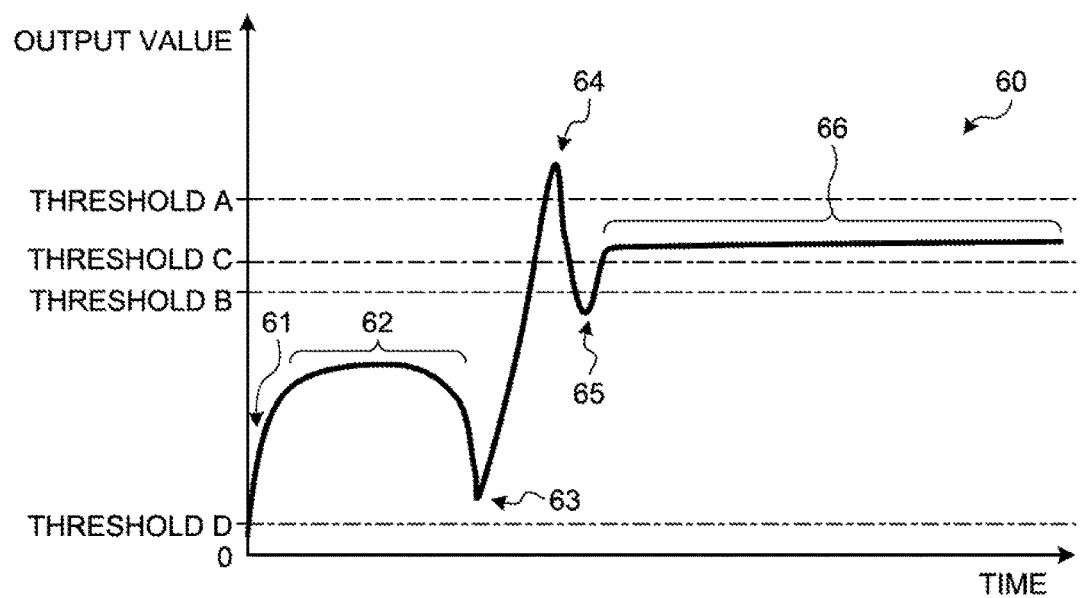
FIG. 12 is a diagram illustrating an example of an output value in a case where a key with a finger being put thereon continues to be pressed.

FIG. 12 is a diagram illustrating an example of an output value in a case where a key with a finger being put thereon continues to be pressed. As illustrated in FIG. 12, a graph 60 is a graph that indicates a time course of an output value in a case where the key 11 with a finger being put thereon continues to be pressed. First, as a user puts his or her finger closer to the key 11 for a key input, an output value from the sensor 12 rises as indicated by an output value 61. As a finger is put on the key 11, an output value from the sensor 12 continues as an output value 62 that is greater than or equal to a threshold D and less than or equal to a threshold B. That is, the output value 62 is an initial value of an output value of the key 11 with a finger being put thereon, in a case where a hand is put at a home position.

Then, as a user once causes his or her finger to leave the key 11 in order to execute a key input, an output value from the sensor 12 once decreases as indicated by an output value 63. As the key 11 is hit, an output value from the sensor 12 is temporarily a large value that is greater than or equal to a threshold A as indicated by an output value 64. Subsequently, an output value from the sensor 12 reactively passes through an output value 65 that is less than or equal to the threshold B and continues as an output value 66 that is greater than or equal to a threshold C that is less than the threshold A and greater than the threshold B. Herein, the key 11 is provided in a state where it is pressed. As the output value 66 is continued, the determination unit 13 determines that the key 11 is pressed every time a counter CC is greater than or equal to a threshold p. That is, the determination unit 13 continuously outputs a key code that corresponds to the key 11 to the output unit 14. Subsequently, as a finger leaves the key 11, an output value from the sensor 12 is less than or equal to the threshold D although not illustrated in the drawings, and hence, the determination unit 13 determines that leaving from the key 11 is executed and stops an output of a key code that corresponds to the key 11.

By returning to descriptions for FIG. 5 and FIG. 6, the output unit 14 is realized by, for example, a USB driver Integrated Circuit (IC) or the like. The output unit 14 may be realized by, for example, a communication module such as Bluetooth (registered trademark). As a key code is input from the determination unit 13, the output unit 14 outputs the input key code to a control unit 130 of the terminal device 100 through a USB. Alternatively, the output unit 14 transmits an input key code to the terminal device 100 through Bluetooth (registered trademark). That is, the output unit 14 outputs a key code of the key 11 that is determined to be pressed, by the determination unit 13.

Next, a configuration of the terminal device 100 will be described. As illustrated in FIG. 5 and FIG. 6, the terminal device 100 includes an antenna 101, a camera 102, a display operation unit 103, a battery 104, and a main board 105. The main board 105 includes a communication unit 110, a storage unit 120, and the control unit 130 as functional units.

The antenna 101 is connected to the communication unit 110 on the main board 105. The antenna 101 corresponds to, for example, a wireless Local Area Network (LAN), Bluetooth (registered trademark), or the like. The antenna 101 may correspond to, for example, a third-generation mobile communication system, Long Term Evolution (LTE), or the like.

The camera 102 captures an image. The camera 102 captures an image by using, for example, a Complementary Metal Oxide Semiconductor (CMOS) image sensor, a Charge Coupled Device (CCD) image sensor, or the like, as an imaging element. The camera 102 photoelectrically converts light received by an imaging element and executes Analog/Digital (A/D) conversion thereof to produce an image. The camera 102 outputs a produced image to the control unit 130 on the main board 105. That is, the camera 102 is, for example, a camera incorporated in a tablet terminal or the like.

The display operation unit 103 is a display device for displaying a variety of information and an input device for accepting a variety of operations from a user. For example, the display operation unit 103 is realized by a liquid crystal display or the like as a display device. For example, the display operation unit 103 is realized by a touch panel as an input device. That is, the display operation unit 103 is provided by integrating a display device with an input device. A touch panel that is an example of an input device is allowed to detect, for example, a pressure in 1024 tones, and hence, can output an output value equivalent to an output value from the sensor 12. The display operation unit 103 outputs an operation input by a user, as operation information, to the control unit 130 on the main board 105.

The battery 104 supplies electrical power to each unit of the terminal device 100. The battery 104 may supply electrical power to the input device 10 through, for example, a USB. For example, a lithium-ion-polymer secondary battery or a lithium-ion secondary battery can be used for the battery 104. The battery 104 is charged as the terminal device 100 is connected to an external power supply.

The communication unit 110 is realized by, for example, a communication module such as a wireless LAN or Bluetooth (registered trademark) or the like. The communication unit 110 may be realized by, for example, a third generation mobile communication system, a communication module such as LTE, or the like. The antenna 101 is connected to the communication unit 110. The communication unit 110 is a communication interface that is wirelessly connected to another information processing device through a non-illustrated network and is responsible for communication of information with the other information processing device. The communication unit 110 receives a key code from the input device 10 in a case where connection between the input device 10 and the terminal device 100 is executed by, for example, Bluetooth (registered trademark). The communication unit 110 outputs a received key code to the control unit 130.

The storage unit 120 is realized by, for example, a semiconductor memory element such as a RAM or a Flash Memory or a storage device such as a hard disk or an optical disk. The storage unit 120 stores information that is used for a process in the control unit 130.

The control unit 130 is realized by, for example, a CPU, a MPU, or the like that executes a program stored in an internal storage device while a RAM is a working area. The control unit 130 may be realized by, for example, an integrated circuit such as an ASIC or an FPGA. The control unit 130 includes an acceptance unit 131 and realizes or executes a function or action of information processing as described below. An internal configuration of the control unit 130 is not limited to a configuration as illustrated in FIG. 6 but may be another configuration as long as such a configuration executes information processing as described below.

As a key code is input from the input device 10 through, for example, a USB driver IC on the main board 105, the acceptance unit 131 accepts a key input based on an input key code. That is, the acceptance unit 131 accepts a key input based on a key code output from the output unit 14 of the input device 10. A key code from the input device 10 is input to the acceptance unit 131 through the communication unit 110 in a case where Bluetooth (registered trademark) is used for communication between the input device 10 and the terminal device 100. The acceptance unit 131 outputs an accepted key input to, for example, another program or application that operates on the control unit 130.

Figure 13:
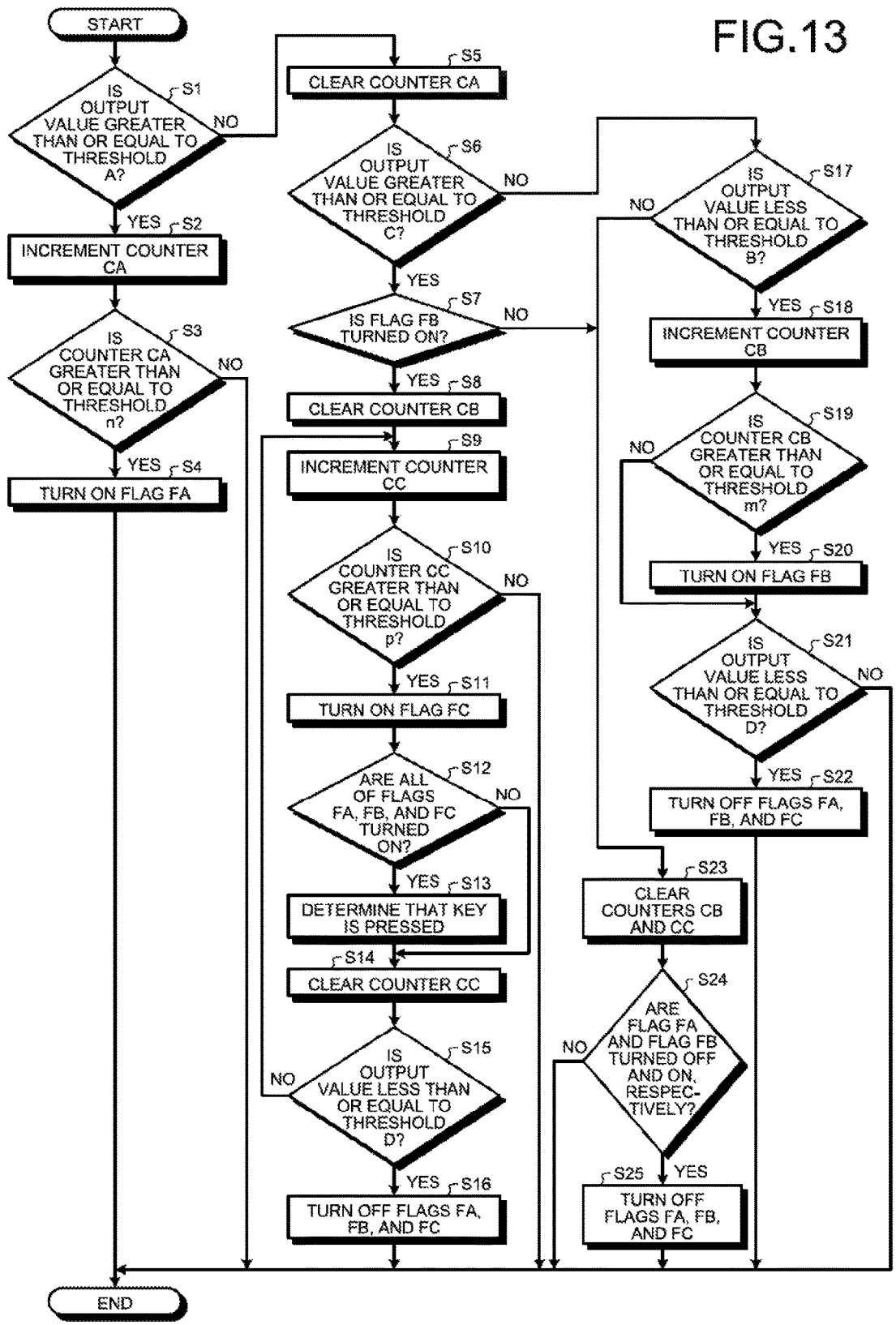
FIG. 13 is a flowchart illustrating an example of a determination process according to a first embodiment.

Next, an operation of the input device 10 according to a first embodiment will be described. FIG. 13 is a flowchart illustrating an example of a determination process according to the first embodiment.

The determination unit 13 of the input device 10 determines whether or not an output value from the sensor 12 is greater than or equal to a threshold A (step S1). In a case where it is determined that an output value from the sensor 12 is greater than or equal to the threshold A (step S1: Yes), the determination unit 13 increments a counter CA (step 2). The determination unit 13 determines whether or not the counter CA is greater than or equal to a threshold n (step S3). In a case where it is determined that the counter CA is greater than or equal to the threshold n (step S3: Yes), the determination unit 13 turns on a flag FA (step S4) and ends such a determination process. In a case where it is determined that the counter CA is not greater than or equal to the threshold n (step S3: No), the determination unit 13 ends the determination process.

In a case where it is determined that an output value from the sensor 12 is not greater than or equal to the threshold A (step S1: No), the determination unit 13 clears the counter CA (step S5). The determination unit 13 determines whether or not an output value from the sensor 12 is greater than or equal to a threshold C (step S6). In a case where it is determined that an output value from the sensor 12 is greater than or equal to the threshold C (step S6: Yes), the determination unit 13 determines whether or not a flag FB is turned on (step S7).

In a case where it is determined that the flag FB is not turned on (step S7: No), the determination unit 13 goes to step S23. In a case where it is determined that the flag FB is turned on (step S7: Yes), the determination unit 13 clears a counter CB (step S8). The determination unit 13 increments a counter CC (step S9).

The determination unit 13 determines whether or not the counter CC is greater than or equal to a threshold p (step S10). In a case where it is determined that the counter CC is not greater than or equal to the threshold p (step S: No), the determination unit 13 ends the determination process.

In a case where it is determined that the counter CC is greater than or equal to the threshold p (step S10: Yes), the determination unit 13 turns on a flag FC (step S11). The determination unit 13 determines whether or not all of the flags FA, FB, and FC are turned on (step S12). In a case where it is determined that all of the flags FA, FB, and FC are turned on (step S12: Yes), the determination unit 13 determines that the key 11 is pressed (step S13). The determination unit 13 outputs a key code of the key 11 determined to be pressed to the output unit 14. As a key code is input, the output unit 14 outputs an input key code to the terminal device 100 through a USB. The determination unit 13 clears the counter CC (step S14). In a case where it is determined that not all of the flags FA, FB, and FC are turned on (step S12: No), the determination unit 13 determines that the key 11 is not pressed, and goes to step S14.

The determination unit 13 determines whether or not an output value from the sensor 12 is less than or equal to the threshold D (step S15). In a case where it is determined that an output value from the sensor 12 is not less than or equal to the threshold D (step S15: No), the determination unit 13 returns to step S9 and corresponds to a continuous input in a case where the key 11 continues to be pressed. In a case where it is determined that an output value from the sensor 12 is less than or equal to the threshold D (step S15: Yes), the determination unit 13 turns off the flags FA, Fab, and FC (step S16) and ends the determination process.

By returning to descriptions for step S6, in a case where it is determined that an output value from the sensor 12 is not greater than or equal to the threshold C (step S6: No), the determination unit 13 determines whether or not an output value from the sensor 12 is less than or equal to the threshold B (step S17). In a case where it is determined that an output value from the sensor 12 is less than or equal to the threshold B (step S17: Yes), the determination unit 13 increments the counter CB (step S18). The determination unit 13 determines whether or not the counter CB is greater than or equal to a threshold m (step S19). In a case where it is determined that the counter CB is greater than or equal to the threshold m (step S19: Yes), the determination unit 13 turns on the flag FB (step S20) and goes to step S21. In a case where it is determined that the counter CB is not greater than or equal to the threshold m (step S19: No), the determination unit 13 goes to step S21.

The determination unit 13 determines whether or not an output value from the sensor 12 is less than or equal to the threshold D (step S21). In a case where it is determined that an output value from the sensor 12 is not less than or equal to the threshold D (step S21: No), the determination unit 13 ends the determination process. In a case where it is determined that an output value from the sensor 12 is less than or equal to the threshold D (step S21: Yes), the determination unit 13 turns off the flags FA, FB, and FC (step S22), and ends the determination process.

By returning to descriptions for step S17, in a case where it is determined that an output value from the sensor 12 is not less than or equal to the threshold B (step S17: No), the determination unit 13 clears the counters CB and CC (step S23). The determination unit 13 determines whether or not the flag FA is turned off and the flag FB is turned on (step S24). In a case where it is determined that the flag FA is turned off and the flag FB is turned on (step S24: Yes), the determination unit 13 determines turns off the flags FA, FB, and FC (step S25) and ends the determination process. In a case where it is determined that the flag FA is not turned off or the flag FB is not turned on (step S24: No), the determination unit 13 ends the determination process. The input device 10 repeats the determination process as described above for each sampling rate of the sensor 12, thereby detecting a pattern of an output value and determining a press of the key 11, and hence, erroneously detecting an operation for putting a finger on the key 11 as a press can be reduced.

Although a case where the terminal device 100 is separated from the input device 10 has been described in the first embodiment as described above, this is not limiting. For example, the terminal device 100 may also include a state where the input device 10 is connected to the terminal device 100.

Thus, the input device 10 includes the sensor 12 that outputs an output value dependent on a pressing force. The input device 10 determines that a contacted place is pressed, based on an output value output from the sensor 12, in a case where a first output value is detected and subsequently a third output value that is less than the first output value and greater than a second output value that is less than the first output value is detected through the second output value. The input device 10 outputs a determined result. As a result, erroneously detecting an operation for putting a finger on the key 11 as a press can be reduced.

The sensor 12 of the input device 10 is a plurality of the sensors 12 associated with a plurality of the keys 11, respectively. The input device 10 determines that the key 11 that corresponds to the contacted sensor 12 is pressed, based on an output value output from the sensor 12, in a case where the first output value is detected and subsequently the third output value is detected through the second output value. The input device 10 outputs a key code of the key 11 that is determined to be pressed. As a result, a key code of the key 11 determined to be pressed can be output.

The input device 10 detects a first output value by using a first threshold, a second output value by using a second threshold, and a third output value by using the first threshold and a third threshold. As a result, it can be determined that the key 11 is pressed in a case where an output value has a specific pattern.

The input device 10 detects a third output value in a case where a time when an output value is greater than or equal to a third threshold among thresholds for detecting a third output value continues for a predetermined period of time. As a result, erroneous detection of a press can be further reduced.

The sensor 12 of the input device 10 is an electrostatic capacitance sensor or a pressure sensor. As a result, a level of contact, that is, an output value dependent on a pressing force, can be output based on a change in electrostatic capacitance or a change in a pressure that is caused by a finger of a user.

The terminal device 100 includes a plurality of the sensors 12 that are associated with a plurality of the keys 11, respectively, and output a plurality of output values dependent on a pressing force. The terminal device 100 determines whether or not a first output value is detected and subsequently a third output value that is less than the first output value and greater than a second output value that is less than the first output value is detected through the second output value, based on an output value output from the sensor 12. That is, the terminal device 100 determines that the key 11 that corresponds to the contacted sensor 12 is pressed, in a case where a first output value is detected and subsequently a third output value is detected through a second output value. The output unit 14 of the terminal device 100 outputs a key code of the key 11 determined to be pressed. The acceptance unit 131 of the terminal device 100 accepts a key input based on a key code output from the output unit 14. Thereby, the terminal device 100 can reduce erroneously detecting an operation for putting a finger on the key 11 as a press.

[b] Second Embodiment

Figure 14:
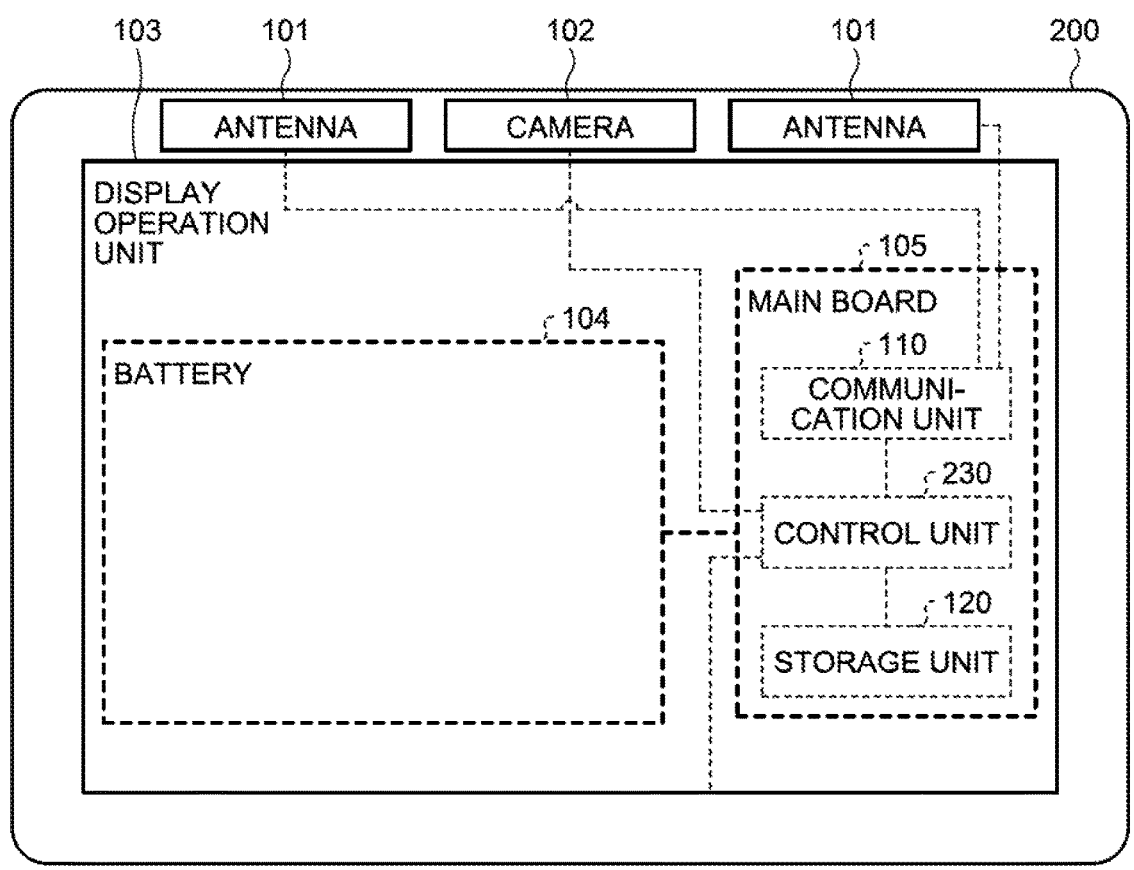
FIG. 14 is a diagram illustrating an example of a hardware configuration of a terminal device according to a second embodiment.
Figure 15:
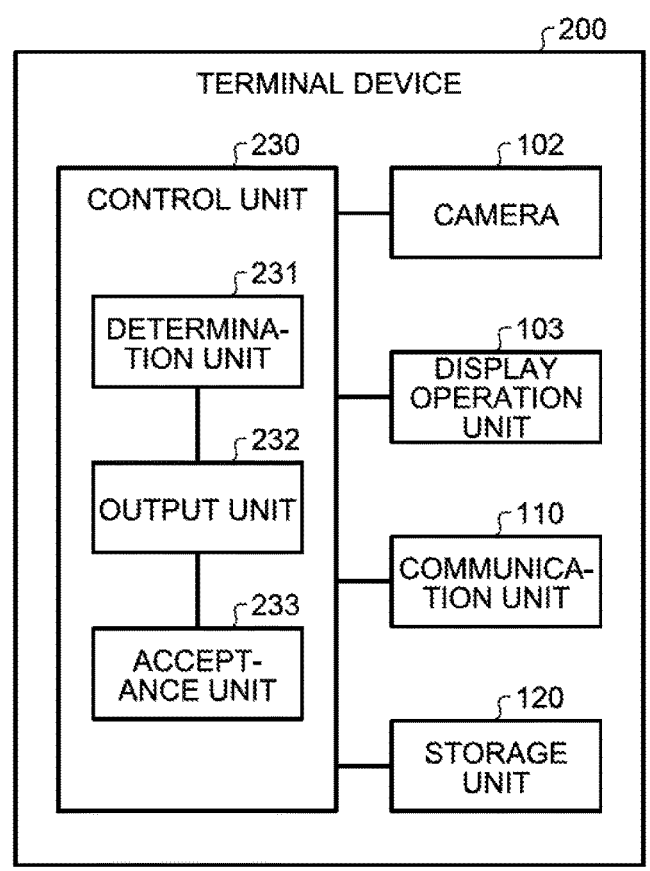
FIG. 15 is a block diagram illustrating an example of a functional configuration of a terminal device according to a second embodiment.

Although the input device 10 includes a plurality of the keys 11 associated with a plurality of the sensors 12 in the first embodiment as described above, a software keyboard may be displayed on the display operation unit 103 of the terminal device 100 to accept a key input, and an embodiment in such a case will be described as a second embodiment. FIG. 14 is a diagram illustrating an example of a hardware configuration of a terminal device according to the second embodiment. FIG. 15 is a block diagram illustrating an example of a functional configuration of a terminal device according to the second embodiment. A configuration identical to that of the terminal device 100 according to the first embodiment will be provided with an identical symbol to omit a description for a redundant configuration and operation thereof.

As illustrated in FIG. 14 and FIG. 15, a terminal device 200 according to the second embodiment causes the display operation unit 103 to display a software keyboard so that a key input is input, and hence, the input device 10 is omitted as compared with the first embodiment. A control unit 230 of the terminal device 200 according to the second embodiment includes an acceptance unit 233 instead of the acceptance unit 131, as compared with the control unit 130 of the terminal device 100 according to the first embodiment. The control unit 230 includes a determination unit 231 and an output unit 232 that correspond to the determination unit 13 and the output unit 14 of the input device 10 according to the first embodiment. The terminal device 200 accepts a key input by a software keyboard displayed on the display operation unit 103, instead of the key 11 and the sensor 12 in the first embodiment.

Figure 16:
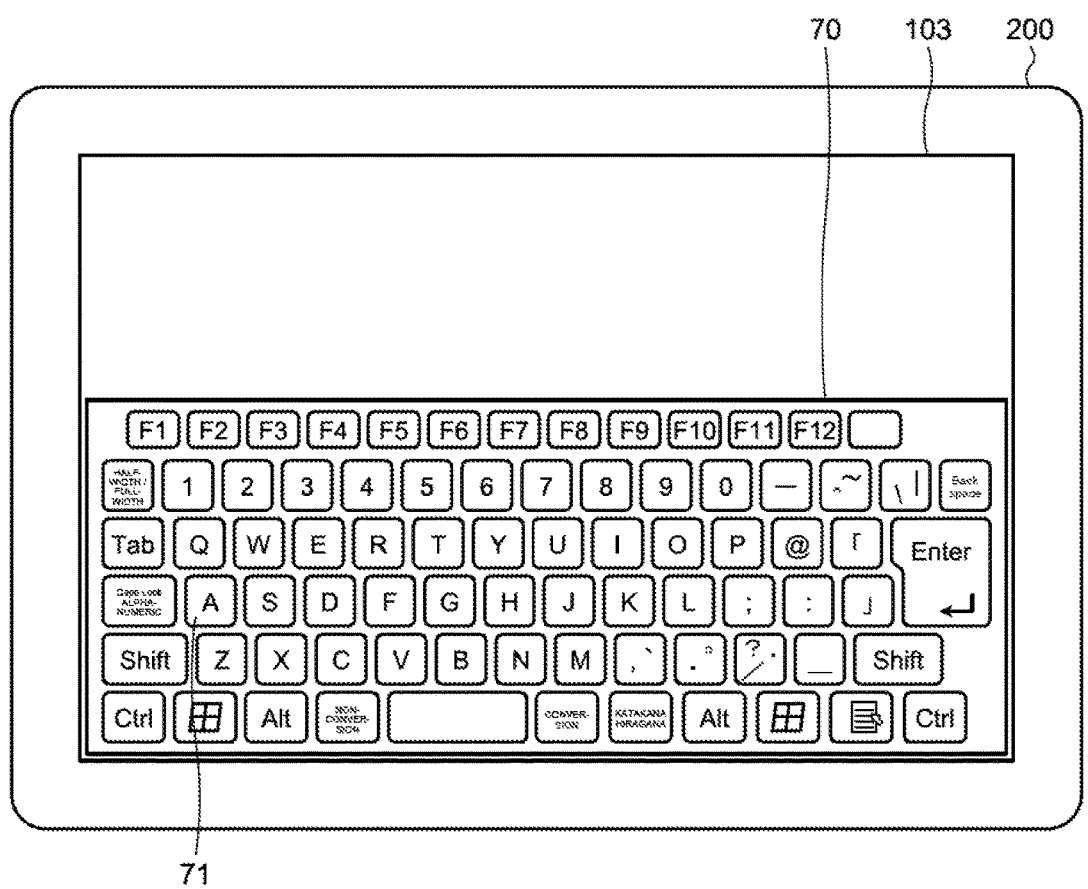
FIG. 16 is a diagram illustrating an example of a software keyboard.

FIG. 16 is a diagram illustrating an example of a software keyboard. As illustrated in FIG. 16, a software keyboard 70 is displayed on the display operation unit 103 of the terminal device 200 and accepts a key input from a user. The display operation unit 103 with the software keyboard 70 displayed thereon outputs an output value dependent on contact for an area 71 that corresponds to each key of the software keyboard 70. That is, the area 71 corresponds to the key 11 and the sensor 12 in the first embodiment. FIG. 16 illustrates an "A" key as an example of the area 71.

In other words, the display operation unit 103 is a display device that displays the software keyboard 70. The display operation unit 103 is provided on a display device and corresponds to an input device that outputs an output value for each area 71 where the area 71 that corresponds to each of a plurality of sensors is associated with each of a plurality of keys of the software keyboard 70.

By returning to descriptions for FIG. 14 and FIG. 15, for example, a button on a display screen displayed on the display operation unit 103 is pressed by a user, and thereby, the control unit 230 causes the display operation unit 103 to display the software keyboard 70. In a case where the software keyboard 70 is not displayed, the control unit 230 detects contact with the display operation unit 103 by using, for example, a threshold that is an average based on a predetermined period of time as a reference. A predetermined period of time herein can be, for example, last 1 second. In a case where the software keyboard 70 is displayed, the control unit 230 transfers a process for detection of contact with a part of the software keyboard 70 to the determination unit 231.

The determination unit 231 determines a press of each area 71 based on output values of a plurality of the areas 71 that are output from the display operation unit 103 with the software keyboard 70 displayed thereon. An output value that corresponds to each area 71, from the display operation unit 103 with the software keyboard 70 displayed thereon, is input to the determination unit 231. The determination unit 231 determines that a contacted area 71 is pressed, based on an output value of each area 71 with an input, in a case where a first output value is detected and subsequently a third output value is detected through a second output value. The determination unit 231 outputs, to the output unit 232, information of a position of an area 71 determined to be pressed, on the display operation unit 103. A detail of a first output value, a second output value, a third output value, and a determination process in the determination unit 231 is similar to that of the first embodiment, and hence, a description thereof will be omitted.

As information of a position of an area 71 determined to be pressed is input from the determination unit 231, the output unit 232 acquires a key code of a key that corresponds to a determined area 71 with reference to a key correspondence information that is preliminarily stored in the storage unit 120. The output unit 232 outputs an acquired key code to the acceptance unit 233. That is, the output unit 232 outputs a key code of a key that corresponds to the area 71 determined to be pressed, by the determination unit 231. Key correspondence information is, for example, information that associates information of a position on the display operation unit 103 with a key layout of the software keyboard 70.

As a key code is input from the output unit 232, the acceptance unit 233 accepts a key input based on an input key code. The acceptance unit 233 outputs an accepted key input to, for example, another program or application that operates on the control unit 230.

An operation of the terminal device 200 according to the second embodiment is similar to a determination process of the input device 10 according to the first embodiment, and hence, a detailed description thereof will be omitted. The terminal device 200 repeats a determination process for each sampling rate of the area 71 to detect a pattern of an output value and determine a press of a key that corresponds to the area 71, and hence, erroneously detecting an operation for putting a finger on a key of the software keyboard 70 as a press can be reduced.

Thus, the terminal device 200 includes a display device that displays a keyboard and an input device that is provided on the display device and with the areas 71 that correspond to a plurality of sensors, respectively, being associated with a plurality of keys of the key board, respectively, and outputs an output value for each of the areas 71. The terminal device 200 determines that the contacted area 71 is pressed, based on an output value that corresponds to the area 71, in a case where a first output value is detected and subsequently a third output value is detected through a second output value. The terminal device 200 outputs a key code of a key that corresponds to the area 71 determined to be pressed. As a result, erroneously detecting an operation for putting a finger on a key of the software keyboard 70 as a press can be reduced.

Although a QWERTY layout keyboard has been described as an example in each of the embodiments as described above, this is not limiting. For example, a JIS layout or thumb shift layout keyboard for inputting a kana character may be provided. A variety of keyboards such as a 101 keyboard, a 104 keyboard, a 106 keyboard, and a 109 keyboard that have a numeric keypad may be provided.

Although a set of thresholds A to D is provided as thresholds A to D for an output value from the sensor 12 or the area 71 in each of the embodiments as described above, this is not limiting. For example, thresholds A to D may be adjusted for a key that is assigned to each finger in such a manner that thresholds A to D that correspond to a key with an input being executed by a little finger are values smaller than thresholds A to D for another finger, or the like.

Each component of each unit as illustrated in the drawings need not be physically configured as illustrated in the drawings. That is, a specific manner of dispersion or integration of respective units is not limited to that illustrated in the drawings, and a configuration can be provided in such a manner that all or parts thereof are functionally or physically dispersed or integrated in any unit depending on a variety of loads, usage, or the like. For example, the determination unit 231 may be integrated with the output unit 232. Respective steps as illustrated in the drawings are not limited to those in an order as described above and may be executed simultaneously or may be executed by changing an order thereof as long as content of steps is consistent.

All or any part of a variety of processes or functions that are executed in each device may be executed on a CPU (or a microcomputer such as a MPU or a Micro Controller Unit (MCU)). It goes without saying that all or any part of a variety of processes or functions may be executed on a program that is analyzed and executed by a CPU (or a microcomputer such as a MPU or a MCU) or hardware based on a wired logic.

The input device 10 and the terminal device 200 as described in each of the embodiments as described above read and execute an input control program so that a function similar to a process as illustrated in FIG. 6, FIG. 15 or the like can be executed. For example, the input device 10 executes a process for executing a process similar to that of the determination unit 13, so that a process similar to that of the first embodiment as described above can be executed. For example, the terminal device 200 executes a process for executing processes similar to those of the determination unit 231, the output unit 232, and the acceptance unit 233, so that a process similar to that of the second embodiment as described above can be executed.

Such a program can be distributed through a network such as the Internet. Such a program is recorded in a computer-readable recording medium such as a hard disk, a flexible disk (FD), a CD-ROM, an MO, or a DVD and can be read from the recording medium and executed by a computer.

Erroneously detecting an operation for putting a finger on a key as a press can be reduced.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An input device, comprising:
a sensor that outputs output values in a predetermined pattern when an object contacts and presses the sensor once;
a determination unit that determines, upon detecting the output values in the predetermined pattern, that the sensor was pressed once,
wherein the predetermined pattern comprises:
a first output value;
a second output value that follows the first output value and that is less than the first output value;
a third output value that follows the second output value and that is less than the first output value and greater than the second output value; and
an output unit that outputs a result determined by the determination unit.

2. The input device according to claim 1, wherein
the sensor is a sensor among a plurality of sensors associated with a plurality of keys,
the determination unit determines, upon detecting the output values in the predetermined pattern, that a key corresponding to the sensor was pressed once, and
the output unit outputs a key code of the key determined to have been pressed once, by the determination unit.

3. The input device according to claim 1, wherein the determination unit detects the first output value using a first threshold, the second output value using a second threshold, and the third output value using the first threshold and a third threshold to determine that the sensor is pressed once.

4. The input device according to claim 3, wherein the determination unit detects the third output value when a time when the output value is greater than or equal to the third threshold continues for a predetermined period of time to determine that the sensor is pressed once.

5. The input device according to claim 1, wherein the sensor is an electrostatic capacitance sensor or a pressure sensor.

6. A terminal device, comprising:
a plurality of sensors that are associated with a plurality of keys, wherein a sensor among the sensors outputs output values in a predetermined pattern when an object contacts and presses the sensor once;
a determination unit that determines that, upon detecting the output values in the predetermined pattern, a first key among the plurality of keys that corresponds to the sensor was pressed once,
wherein the predetermined pattern comprises:
a first output value;
a second output value that follows the first output value and that is less than the first output value;
a third output value that follows the second output value and that is less than the first output value and greater than the second output value;
an output unit that outputs a key code of the first key determined to have been pressed once, by the determination unit; and
an acceptance unit that accepts a key input based on the key code output form the output unit.

7. The terminal device according to claim 6, further comprising:
a display device that displays a keyboard including the plurality of keys; and
an input device provided on the display device with areas that correspond to the plurality of keys,
wherein:
the input device outputs the output values in the predetermined pattern when the object contacts and presses an area among the areas once,
the determination unit determines, upon detecting the output values in the predetermined pattern, that a second key among the plurality of keys corresponding to the area was pressed once, and
the output unit outputs the key code of the second key determined to have been pressed once, by the determined unit.

8. A non-transitory computer-readable recording medium having stored therein an input control program that causes a computer to execute a process comprising:
determining that a sensor is contacted and pressed once upon detecting that the sensor outputs output values in a predetermined pattern,
wherein the predetermined pattern comprises:
a first output value;
a second output value that follows the first output value and that is less than the first output value; and
a third output value that follows the second output value and that is less than the first output value and greater than the second output value; and
outputting a determined result.

* * * * *